United States Patent
Chen et al.

(10) Patent No.: US 9,202,826 B2
(45) Date of Patent: Dec. 1, 2015

(54) PIXEL STRUCTURE

(71) Applicant: E Ink Holdings Inc., Hsinchu (TW)

(72) Inventors: Jia-Hung Chen, Hsinchu (TW); Yu-Mao Lin, Hsinchu (TW); Kuang-Heng Liang, Hsinchu (TW); Chih-Chien Chiou, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/164,278

(22) Filed: Jan. 27, 2014

(65) Prior Publication Data

US 2014/0306226 A1 Oct. 16, 2014

(30) Foreign Application Priority Data

Apr. 12, 2013 (TW) .............................. 102113068 A (51) Int. Cl.
*H01L 29/12* (2006.01)
*H01L 29/04* (2006.01)
*H01L 23/12* (2006.01)
*H01L 27/12* (2006.01)

(52) U.S. Cl.
CPC ........ *H01L 27/1255* (2013.01); *H01L 27/1214* (2013.01)

(58) Field of Classification Search
CPC ..... H01L 27/1214; H01L 27/12; H01L 27/13; H01L 29/66757; H01L 27/3258; H01L 51/5271; G02F 1/136213
USPC .............. 257/71, 59, 749; 438/158, 155, 597; 349/38, 43, 114, 146
See application file for complete search history.

(56) References Cited

U.S. PATENT DOCUMENTS

| 6,295,109 | B1 | 9/2001 | Kubo et al. |
| 6,441,873 | B2 * | 8/2002 | Young .............................. 349/43 |
| 7,388,624 | B2 | 6/2008 | Chen et al. |
| 7,426,004 | B2 | 9/2008 | Hu et al. |
| 7,446,845 | B2 | 11/2008 | Matsuda et al. |
| 7,522,224 | B2 | 4/2009 | Hwang et al. |
| 7,872,713 | B2 | 1/2011 | Chen et al. |
| 7,956,963 | B2 | 6/2011 | Chien |
| 8,013,946 | B2 | 9/2011 | Ha et al. |
| 8,027,001 | B2 | 9/2011 | Kaneko et al. |
| 8,184,219 | B2 | 5/2012 | Luo et al. |

(Continued)

OTHER PUBLICATIONS

"Office Action of Taiwan Counterpart Application," issued on Mar. 23, 2015, p. 1-4, in which the listed references were cited.

*Primary Examiner* — Long K Tran
*Assistant Examiner* — Dzung Tran
(74) *Attorney, Agent, or Firm* — Jianq Chyun IP Office (57) ABSTRACT

A pixel structure including a substrate, an active device located on the substrate, a second reflective pattern, and a third reflective pattern is provided. The active device includes a gate, a channel, a source, and a drain. The source and the drain are connected to the channel and are separated from each other. The channel and the gate are stacked in a thickness direction. The second reflective pattern and the third reflective pattern are electrically connected to the drain of the active device. The second reflective pattern has second contact openings. The third reflective pattern is stacked on the second reflective pattern and covers the second contact openings of the second reflective pattern. The second reflective pattern is located between the third reflective pattern and the substrate. Moreover, other kinds of pixel structures are also provided.

12 Claims, 9 Drawing Sheets

(56) References Cited

U.S. PATENT DOCUMENTS

| | | |
|---|---|---|
| 8,208,103 B2 | 6/2012 | Miyamoto et al. |
| 8,228,469 B2 | 7/2012 | Kubo et al. |
| 8,264,652 B2 | 9/2012 | Ahn |
| 8,294,854 B2 | 10/2012 | Kikuchi et al. |
| 2004/0070709 A1* | 4/2004 | Kanou et al. .................. 349/113 |
| 2004/0105056 A1* | 6/2004 | Iida et al. ...................... 349/113 |
| 2007/0058099 A1* | 3/2007 | Eguchi ............................ 349/43 |
| 2007/0058116 A1* | 3/2007 | Lee et al. ...................... 349/114 |
| 2007/0200985 A1* | 8/2007 | Kaneko et al. ................ 349/114 |
| 2008/0239217 A1* | 10/2008 | Inoue et al. ................... 349/114 |
| 2010/0055850 A1* | 3/2010 | Chiang et al. ................. 438/155 |

* cited by examiner

PIXEL STRUCTURE

CROSS-REFERENCE TO RELATED APPLICATION

This application claims the priority benefit of Taiwan application serial no. 102113068, filed on Apr. 12, 2013. The entirety of the above-mentioned patent application is hereby incorporated by reference herein and made a part of this specification.

BACKGROUND OF THE INVENTION

1. Field of the Invention

The invention relates to a pixel structure. More particularly, the invention relates to a reflective pixel structure.

2. Description of Related Art

To match the life style of modern people, video or image display devices have been developed to be small and compact. Therefore, the flat panel displays characterized by compactness, slimness, and low power consumption become the mainstream of display products.

Displays may be categorized into reflective displays (including transflective displays) and transmissive displays according to the way in which light sources are utilized. The transmissive display is mainly comprised of a transmissive display panel and a backlight module. The display medium injected into the transmissive display panel cannot emit light; thus, the transmissive display panel has to be illuminated by a light source provided by the backlight module, so that the transmissive display can display images. By contrast, the reflective display includes a reflective display panel. Since the reflective display panel cannot emit light, the reflective display panel has to be illuminated by reflecting external light, so that the reflective display can display images.

According to the related art, in order to optimize the optical characteristics (e.g., view angle) of a conventional reflective display through reflecting the external light toward different directions, an insulation layer with a lumpy structure is often paved with reflective pixel electrodes, such that the reflective pixel electrodes appear to have uneven surfaces to reflect the external light toward various directions. Nevertheless, the uneven structure of the insulation layer has limited diversity, which leads to the difficulty in improving the optical characteristics of the reflective display.

SUMMARY OF THE INVENTION

The invention is directed to several pixel structures, and any reflective display equipped with one of the pixel structures may have favorable optical characteristics.

According to an exemplary embodiment of the invention, a pixel structure is provided. The pixel structure includes a substrate, an active device located on the substrate, a second reflective pattern, and a third reflective pattern. The active device includes a gate, a channel, a source, and a drain. The source and the drain are connected to the channel and are separated from each other. The channel and the gate are stacked in a thickness direction. The second reflective pattern and the third reflective pattern are electrically connected to the drain of the active device. The second reflective pattern has a plurality of second contact openings. The third reflective pattern is stacked on the second reflective pattern and covers the second contact openings of the second reflective pattern. The second reflective pattern is located between the third reflective pattern and the substrate.

According to an exemplary embodiment of the invention, another pixel structure is provided. The pixel structure includes a substrate, an active device located on the substrate, a second reflective pattern, and a floating channel layer. The active device includes a gate, a channel, a source, and a drain. The source and the drain are connected to the channel and are separated from each other. The channel and the gate are stacked in a thickness direction. The second reflective pattern is electrically connected to the drain of the active device. The floating channel layer and the channel of the active device are in the same film layer. The floating channel layer is located between the second reflective pattern and the substrate and has a plurality of openings. The second reflective pattern covers the openings of the floating channel layer and is stacked on the floating channel layer.

According to an exemplary embodiment of the invention, another pixel structure is provided. The pixel structure includes a substrate, an active device located on the substrate, a first reflective pattern, and a second reflective pattern. The active device is located on the substrate and includes a gate, a channel, a source, and a drain. The source and the drain are connected to the channel and are separated from each other. The channel and the gate are stacked in a thickness direction. The first reflective pattern is electrically insulated from the gate of the active device, and the first reflective pattern and the gate of the active device are in the same film layer. Besides, the first reflective pattern has a plurality of first contact openings. The second reflective pattern is electrically connected to the drain of the active device. Besides, the second reflective pattern is stacked on the first reflective pattern and completely covers the first reflective pattern and the first contact openings.

In an exemplary embodiment of the intention, the third reflective pattern has at least one third contact opening which exposes the second reflective pattern, and the third contact opening and the second contact openings are not overlapped in the thickness direction.

In an exemplary embodiment of the intention, the second reflective pattern has a bottom surface facing the substrate, and each of the second contact openings has an inclined surface inclining relative to the substrate. A first included angle within the second reflective pattern is defined by the bottom surface of the second reflective pattern and the inclined surface of each of the second contact openings. The third reflective pattern has a bottom surface facing the substrate. The third contact opening of the third reflective pattern has an inclined surface inclining relative to the substrate. A second included angle within the third reflective pattern is defined by the bottom surface of the third reflective pattern and the inclined surface of the third contact opening. The first included angle is different from the second included angle.

In an exemplary embodiment of the invention, the pixel structure further includes a second insulation layer that is located between the second reflective pattern and the third reflective pattern.

In an exemplary embodiment of the invention, the second insulation layer has a plurality of second contact windows, and the second contact windows are filled with the third reflective pattern that is electrically connected to the second reflective pattern.

In an exemplary embodiment of the invention, the second insulation layer has a bottom surface facing the substrate, and each of the second contact windows has an inclined surface inclining relative to the substrate. A third included angle within the second insulation layer is defined by the bottom surface of the second insulation layer and the inclined surface of each of the second contact windows. The third included angle is different from the first included angle.

In an exemplary embodiment of the invention, the third reflective pattern has at least one third contact opening that exposes the second reflective pattern and the second insulation layer.

In an exemplary embodiment of the invention, the pixel structure further includes a floating channel layer. The floating channel layer is located between the second reflective pattern and the substrate and has a plurality of openings. The second reflective pattern covers the openings of the floating channel layer and is stacked on the floating channel layer.

In an exemplary embodiment of the invention, the floating channel layer and the channel of the active device are in the same film layer.

In an exemplary embodiment of the invention, each of the openings of the floating channel layer has an inclined surface inclining relative to the substrate, and the floating channel layer has a bottom surface facing the substrate. A fourth included angle within the floating channel layer is defined by the bottom surface of the floating channel layer and the inclined surface of each of the openings of the floating channel layer. The fourth included angle is different from the first included angle.

In an exemplary embodiment of the invention, the third reflective pattern is in contact with the second reflective pattern.

In an exemplary embodiment of the invention, the second reflective pattern and the drain of the active device are in the same film layer.

In an exemplary embodiment of the invention, the pixel structure further includes a capacitor electrode line that is connected to a reference electric potential. The capacitor electrode line is located between the substrate and the second reflective pattern. The second reflective pattern is located between the third reflective pattern and the capacitor electrode line.

In an exemplary embodiment of the invention, the pixel structure further includes a data line and a scan line. The data line is connected to the source; the scan line is connected to the gate.

In an exemplary embodiment of the invention, the pixel structure further includes a first insulation layer that is located between the substrate and the second reflective pattern.

In an exemplary embodiment of the invention, the pixel structure further includes a first reflective pattern. The first reflective pattern is electrically insulated from the gate of the active device, and the first reflective pattern and the gate of the active device are in the same film layer. Besides, the first reflective pattern has a plurality of first contact openings.

In an exemplary embodiment of the invention, the pixel structure further includes a capacitor electrode line that is connected to a reference electric potential. The capacitor electrode line is located between the substrate and the floating channel layer.

In an exemplary embodiment of the invention, the pixel structure further includes a first insulation layer. The first insulation layer is located between the substrate and the floating channel layer and has a plurality of first contact windows.

In an exemplary embodiment of the invention, the pixel structure further includes a first insulation layer. The first insulation layer is located between the first reflective pattern and the second reflective pattern.

In an exemplary embodiment of the invention, the first insulation layer has a plurality of first contact windows, and the first contact windows are filled with the second reflective pattern.

In an exemplary embodiment of the invention, the first contact windows expose the first reflective pattern, and the first contact windows are filled with the second reflective pattern that is electrically connected to the first reflective pattern.

In an exemplary embodiment of the invention, the first contact windows are located in the first contact openings of the first reflective pattern.

Based on the above, in the pixel structure described in an embodiment of the invention, any two of the floating channel layer, the second reflective pattern, and the third reflective pattern may be stacked together, so as to define reflective surfaces that have different inclined angles or incline toward different directions. Through these reflective surfaces, the pixel structure is able to reflect the incident light toward various directions, so as to optimize the optical characteristics of the reflective display equipped with said pixel structure.

In order to make the aforementioned and other features and advantages of the invention comprehensible, embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
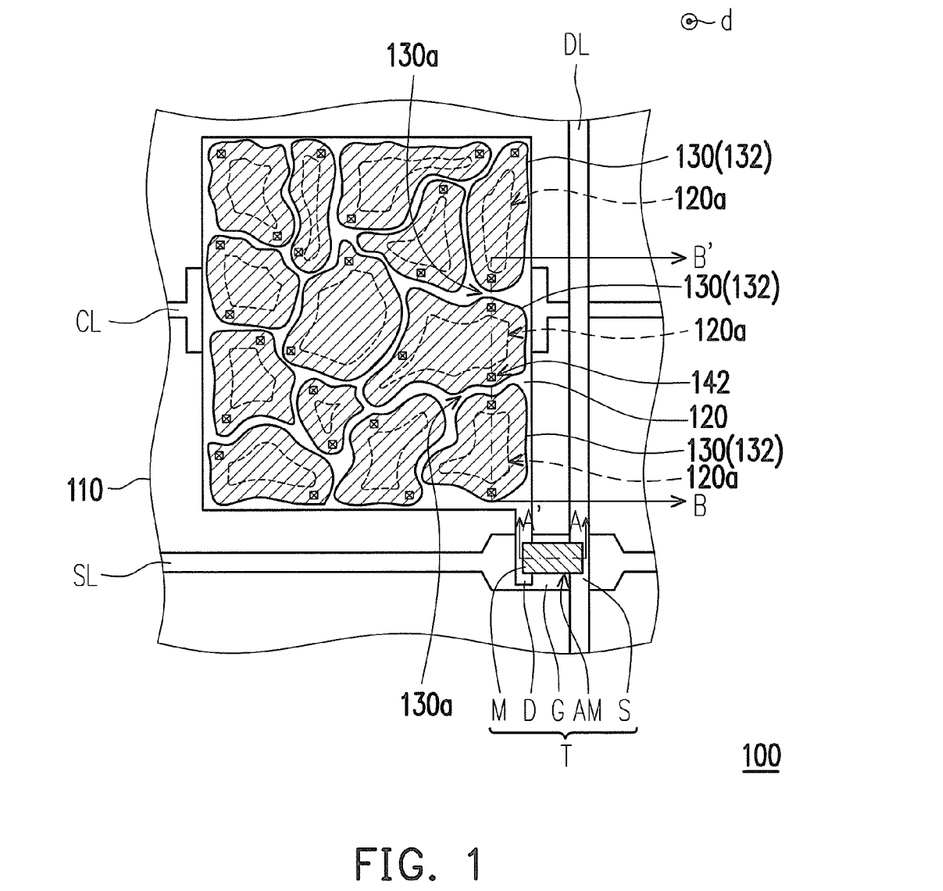
FIG. 1 is a schematic top view illustrating a pixel structure according to an exemplary embodiment of the invention.
Figure 2:
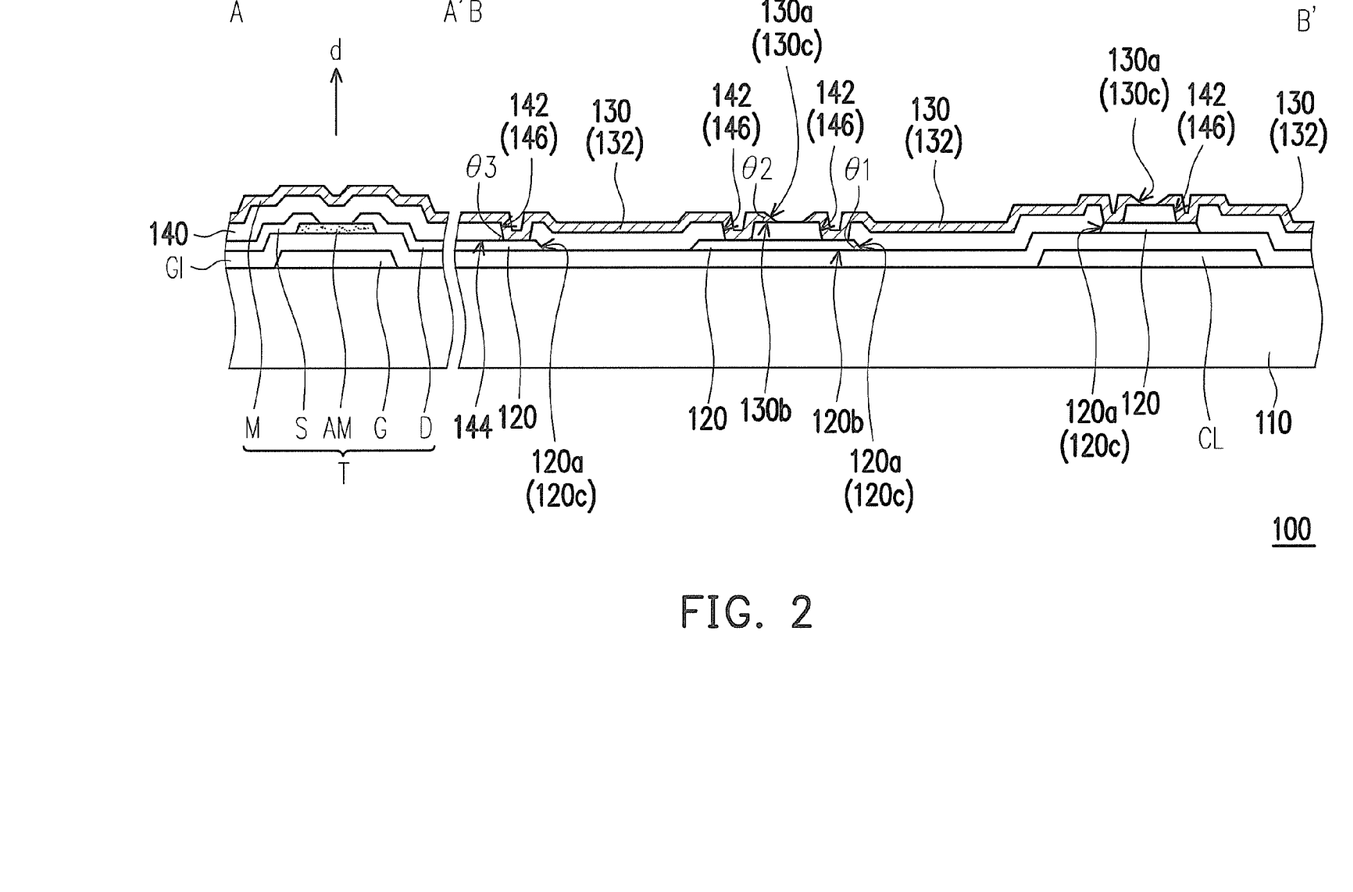
FIG. 2 is a schematic cross-sectional view illustrating the pixel structure of FIG. 1 along a sectional line A-A' and a sectional line B-B'.

FIG. 1 is a schematic top view illustrating a pixel structure according to an exemplary embodiment of the invention. FIG. 2 is a schematic cross-sectional view illustrating the pixel structure of FIG. 1 along a sectional line A-A' and a sectional line B-B'. With reference to FIG. 1 and FIG. 2, the pixel structure 100 includes a substrate 110, an active device T located on the substrate 110, a second reflective pattern 120, and a third reflective pattern 130. The active device T includes a gate G, a channel AM, a source S, and a drain D. The source S and the drain D are connected to the channel AM and are separated from each other. The channel AM and the gate G are stacked in a thickness direction d. In the present embodiment, the gate G may be located between the channel AM and the substrate 110. That is, the active device T described herein may be a bottom-gate thin film transistor (TFT); however, the invention is not limited thereto, and the active device T in other exemplary embodiments may also be a top-gate TFT or any other appropriate TFT. The active device T may further include a light shielding pattern M that covers the channel AM. The light shielding pattern M and the third reflective pattern 130 may be in the same film layer. Here, the light shielding pattern M may prevent the external light from irradiating the channel AM of the active device T, such that the issue of photo-leakage current of the active device T may be resolved, and that the electrical properties of the pixel structure 100 may be optimized.

As shown in FIG. 1, the pixel structure 100 described in the present embodiment further includes a data line DL and a scan line SL. The scan line SL and the gate G of the active device T may be in the same film layer. In particular, according to the present embodiment, the gate G may be a conductive pattern extending from the scan line SL. The data line DL and the source S and the drain D of the active device T may be in the same film layer. In particular, according to the present embodiment, the source S may be a portion of the data line DL. With reference to FIG. 2, the pixel structure 100 further includes a first insulation layer GI that is located between the gate G and the channel AM. Besides, the first insulation layer GI is located between the substrate 110 and the second reflective pattern 120. As shown in FIG. 1 and FIG. 2, the pixel structure 100 further includes a capacitor electrode line CL that is connected to a reference electric potential. In FIG. 2, the capacitor electrode line CL is located between the substrate 110 and the second reflective pattern 120, and the second reflective pattern 120 is located between the third reflective pattern 130 and the capacitor electrode line CL. Namely, the capacitor electrode line CL, the second reflective pattern 120, and the third reflective pattern 130 are in different film layers. According to the present embodiment, the capacitor electrode line CL and the gate G of the active device T may be in the same film layer. The capacitor electrode line CL, the second reflective pattern 120, and the third reflective pattern 130 are overlapped to form the storage capacitor of the pixel structure 100 described herein.

In FIG. 1 and FIG. 2, the second reflective pattern 120 is electrically connected to the drain D of the active device T and has a plurality of second contact openings 120a. Besides, the second reflective pattern 120 is opaque and has great reflectivity. As shown in FIG. 1, the second reflective pattern 120 described herein may be shaped in an irregular manner. Besides, the second reflective pattern 120 and the drain D of the active device T may be in the same film layer. Particularly, the second reflective pattern 120 may be extended from the drain D. In the present embodiment, the second reflective pattern 120 is made of metal, for instance; however, the invention is not limited thereto, and the material of the second reflective pattern 120 in other embodiments may be alloy or any other material that is opaque and has great reflectivity.

As shown in FIG. 2, the second reflective pattern 120 is located between the third reflective pattern 130 and the substrate 110. Namely, the second reflective pattern 120 and the third reflective pattern 130 are in different film layers. Besides, the third reflective pattern 130 is opaque and has great reflectivity. The substrate 110 has a pixel area corresponding to the display images, and the second reflective pattern 120 and the third reflective pattern 130 together cover the entire pixel area. The third reflective pattern 130 is electrically connected to the drain D of the active device T. Specifically, the second contact windows 142 of the second insulation layer 140 are filled with the third reflective pattern 130 that is in contact with the second reflective pattern 120. The third reflective pattern 130 is electrically connected to the drain D of the active device T through the second reflective pattern 120. Here, the third reflective pattern 130 is made of metal, for instance; however, the invention is not limited thereto, and the material of the third reflective pattern 130 in other embodiments may be alloy or any other material that is opaque and has great reflectivity.

As illustrated in FIG. 1 and FIG. 2, the third reflective pattern 130 is stacked on the second reflective pattern 120 and covers the second contact openings 120a of the second reflective pattern 120. Hence, the stacked structure constituted by the second reflective pattern 120 and the third reflective pattern 130 may have plural reflective surfaces. The reflective surfaces have different inclined angles and are inclined toward different directions. Through these reflective surfaces, the pixel structure 100 is able to reflect the incident light toward various directions, so as to optimize the optical characteristics (e.g., view angle) of the reflective display equipped with the pixel structure 100.

As shown in FIG. 2, the third reflective pattern 130 described herein may further have third contact openings 130a. That is, as illustrated in FIG. 1, the third reflective patterns 130 may include a plurality of reflective patterns 132 separated from one another, and gaps among the reflective patterns 132 constitute the third contact openings 130a. According to the present embodiment, the reflective patterns 132 may be shaped in an irregular manner. In FIG. 1 and FIG. 2, the third contact openings 130a of the third reflective pattern 130 expose the second reflective pattern 120, and the third contact openings 130a and the second contact openings 120a are not overlapped in the thickness direction d; therefore, the reflective surfaces formed by stacking the second and third reflective patterns 120 and 130 may be more diverse, and the optical characteristics of the reflective display having the pixel structure 100 may be ameliorated.

As shown in FIG. 2, the second reflective pattern 120 described herein has a bottom surface 120b facing the substrate 110. Each second contact opening 120a has an inclined surface 120c inclining relative to the substrate 110. An included angle $\theta 1$ within the second reflective pattern 120 is defined by the bottom surface 120b and the inclined surface 120c. The third reflective pattern 130 has a bottom surface 130b facing the substrate 110. Each third contact opening 130a has an inclined surface 130c inclining relative to the substrate 110. An included angle $\theta 2$ within the third reflective pattern 130 is defined by the bottom surface 130b and the inclined surface 130c. The included angle $\theta 1$ may be different from the included angle $\theta 2$. Due to the difference between the included angles $\theta 1$ and $\theta 2$, the reflective surfaces (e.g., the inclined surfaces 120c and 130c) formed by stacking the second and third reflective patterns 120 and 130 may have various inclined angles, whereby the pixel structure 100 is able to reflect the incident light toward different directions, and the optical characteristics of the reflective display having the pixel structure 100 may be ameliorated.

As shown in FIG. 2, the pixel structure 100 described herein further includes a second insulation layer 140 that is located between the second reflective pattern 120 and the third reflective pattern 130. The third contact openings 130a expose the second reflective pattern 120 and the second insulation layer 140. The second insulation layer 140 expands the distance between the second reflective pattern 120 and the third reflective pattern 130, so that the pixel structure 100 is more capable of reflecting light toward different directions.

In the present embodiment of the invention, the second insulation layer 140 has a plurality of second contact windows 142. As illustrated in FIG. 2, the second insulation layer 140 has a bottom surface 144 facing the substrate 110. Each second contact window 142 has an inclined surface 146 inclining relative to the substrate 110. An included angle θ3 within the second insulation layer 140 is defined by the bottom surface 144 and the inclined surface 146. The included angle θ3 may be different from the included angle θ2 and also different from the included angle θ1. Due to the difference among the included angles θ1, θ2 and θ3, when the second contact windows 142 are filled with the third reflective pattern 130, the inclined angle of the surface of the third reflective pattern 130 corresponding to the inclined surface 146 is different from the respective inclined angle of the inclined surfaces 120c and 130c. Thereby, the reflective surfaces formed by stacking the second and third reflective patterns 120 and 130 may be more diverse, and the optical characteristics of the reflective display having the pixel structure 100 may be ameliorated.

Figure 3:
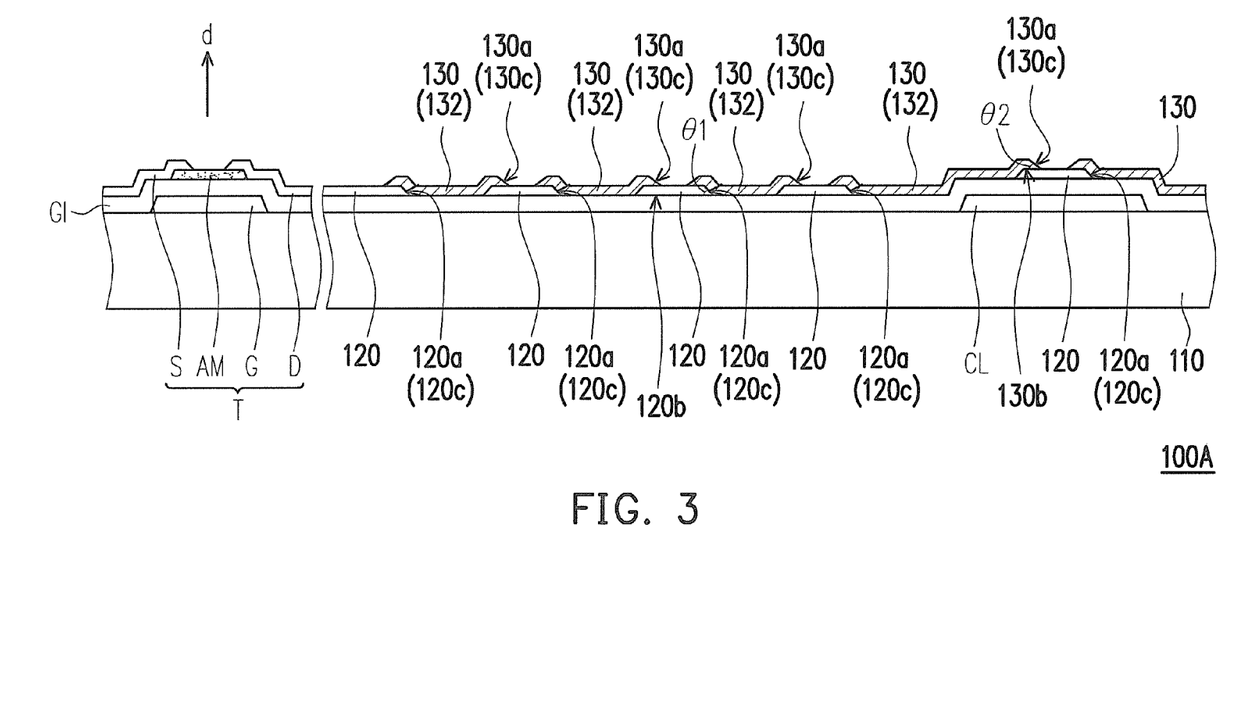
FIG. 3 is a schematic cross-sectional view illustrating a pixel structure according to another exemplary embodiment of the invention.

Nonetheless, the invention is not limited to those described above, and there may exist no second insulation layer 140 between the second reflective pattern 120 and the third reflective pattern 130 in another embodiment of the invention. This will be discussed below with reference to FIG. 3. FIG. 3 is a schematic cross-sectional view illustrating a pixel structure according to another exemplary embodiment of the invention. The pixel structure 100A shown in FIG. 3 is similar to the pixel structure 100 shown in FIG. 1 and FIG. 2, and therefore the same components are labeled by the same reference numbers. With reference to FIG. 3, in the present embodiment, there may be no insulation layer between the second reflective pattern 120 and the third reflective pattern 130. The third reflective pattern 130 may be completely in contact with the second reflective pattern 120. Here, the stacked structure constituted by directly stacking the second reflective pattern 120 and the third reflective pattern 130 may have plural reflective surfaces, and these reflective surfaces have different inclined angles and are inclined toward different directions. Through these reflective surfaces, the pixel structure 100A is able to reflect the incident light toward various directions, so as to optimize the optical characteristics of the reflective display equipped with the pixel structure 100A. In addition, owing to the omission of the insulation layer between the second reflective pattern 120 and the third reflective pattern 130 in the pixel structure 100A shown in FIG. 3, the pixel structure 100A may be formed with use of one less photomask, which reduces the manufacturing costs of the pixel structure 100A.

The reflective surfaces which have different inclined angles and are inclined toward different directions may be formed by stacking the second and third reflective patterns 120 and 130; in addition to the above, another film layer may also be stacked together with the second and third reflective patterns 120 and 130, such that the reflective surfaces formed by stacking the second and third reflective patterns 120 and 130 may be more diverse, and that the optical characteristics of the reflective display having the film layer, the second reflective pattern 120, and the third reflective pattern 130 may be ameliorated. This will be discussed below with reference to FIG. 4.

Figure 4:
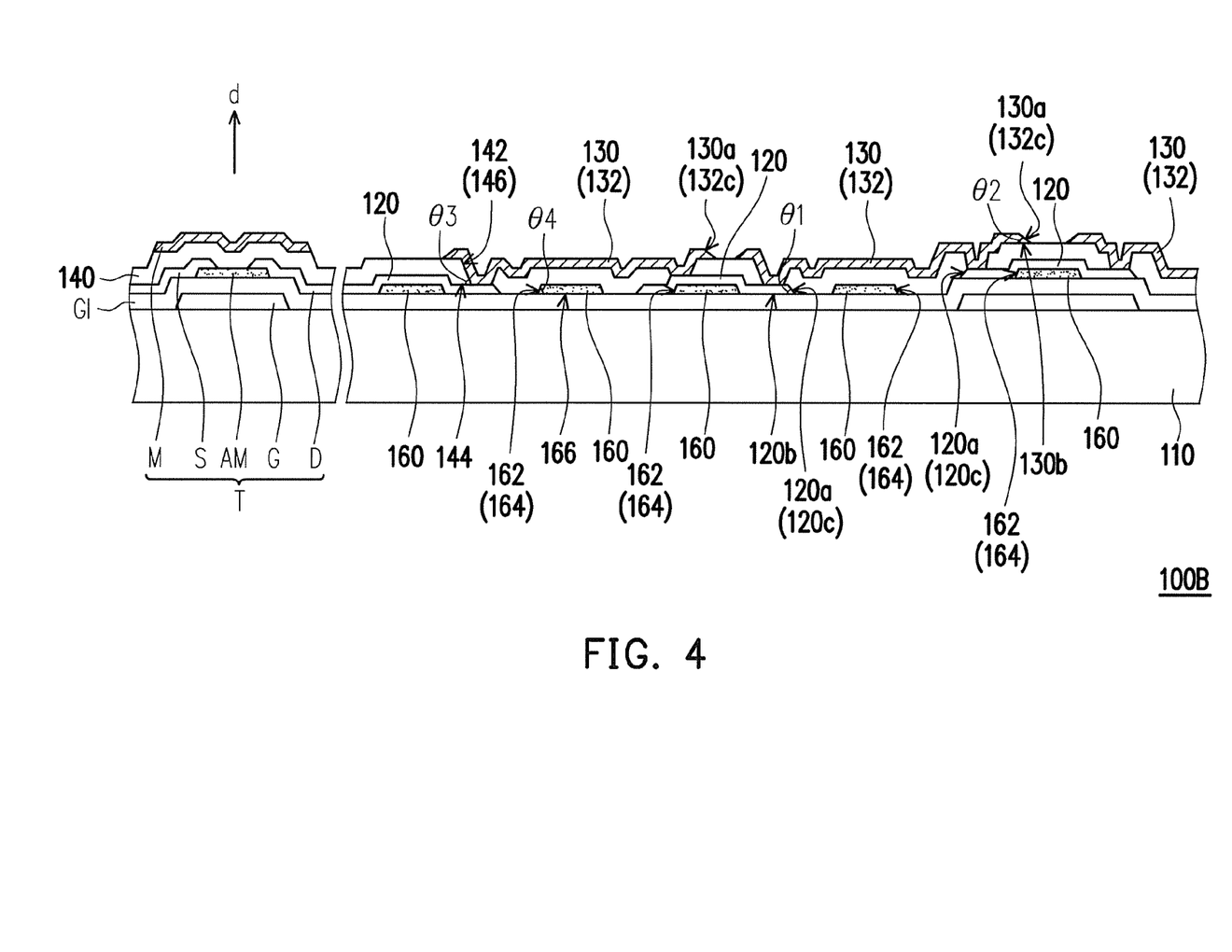
FIG. 4 is a schematic cross-sectional view illustrating a pixel structure according to another exemplary embodiment of the invention.

FIG. 4 is a schematic cross-sectional view illustrating a pixel structure according to another exemplary embodiment of the invention. The pixel structure 100B shown in FIG. 4 is similar to the pixel structure 100 shown in FIG. 1 and FIG. 2, and therefore the same components are labeled by the same reference numbers. The difference between the pixel structure 100B and the pixel structure 100 shown in FIG. 1 and FIG. 2 lies in that the pixel structure 100B further includes a floating channel layer 160. The floating channel layer 160 is located between the second reflective pattern 120 and the substrate 110 and has a plurality of openings 162. The openings 162 in the thickness direction d may penetrate the floating channel layer 160. In the present embodiment, the floating channel layer 160 and the channel AM of the active device T are in the same film layer, and the floating channel layer 160 is separated from the channel AM of the active device T. That is, the floating channel layer 160 is not electrically connected to the active device T and is in a floating state.

As shown in FIG. 4, the second reflective pattern 120 covers the openings 162 and is stacked on the floating channel layer 160. The openings 162 and the third contact openings 130a are not overlapped in the thickness direction d. The floating channel layer 160 equipped with the openings 162 increases the height difference between the second reflective pattern 120 and the third reflective pattern 130, such that the reflective surfaces formed by the second and third reflective patterns 120 and 130 that are stacked on the floating channel layer 160 may be more diverse, and the optical characteristics of the reflective display having the pixel structure 100B may be ameliorated.

Each opening 162 has an inclined surface 164 inclining relative to the substrate 110, and the floating channel layer 160 has a bottom surface 166 facing the substrate 110. An included angle θ4 within the floating channel layer 160 is defined by the bottom surface 166 and the inclined surface 164. The included angle θ4 may be different from the included angle θ1. To be specific, the included angle θ4 may be different from the included angle θ2 and also different from the included angle θ3. Thereby, the reflective surfaces formed by stacking the second and third reflective patterns 120 and 130 on the floating channel layer 160 may be more diverse.

Note that the floating channel layer 160, the second reflective pattern 120, and the third reflective pattern 130 in the pixel structure 100B shown in FIG. 4 together define the reflective surfaces that have different inclined angles and incline toward different directions, so as to optimize the optical characteristics of the reflective display equipped with the pixel structure 100B. However, the invention is not limited thereto, and any two of the film layers (e.g., the floating channel layer 160, the first reflective pattern, the second reflective pattern 120, and the third reflective pattern 130) in the pixel structure may be stacked together to define reflective surfaces that have different inclined angles and incline toward different directions. Thereby, the optical characteristics of the reflective display equipped with the pixel structure may be ameliorated. Note that at least one of the two stacked film layers is required to be characterized by reflectivity. This will be exemplified below with reference to FIG. 5, FIG. 6, FIG. 7, FIG. 8, and FIG. 9.

Figure 5:
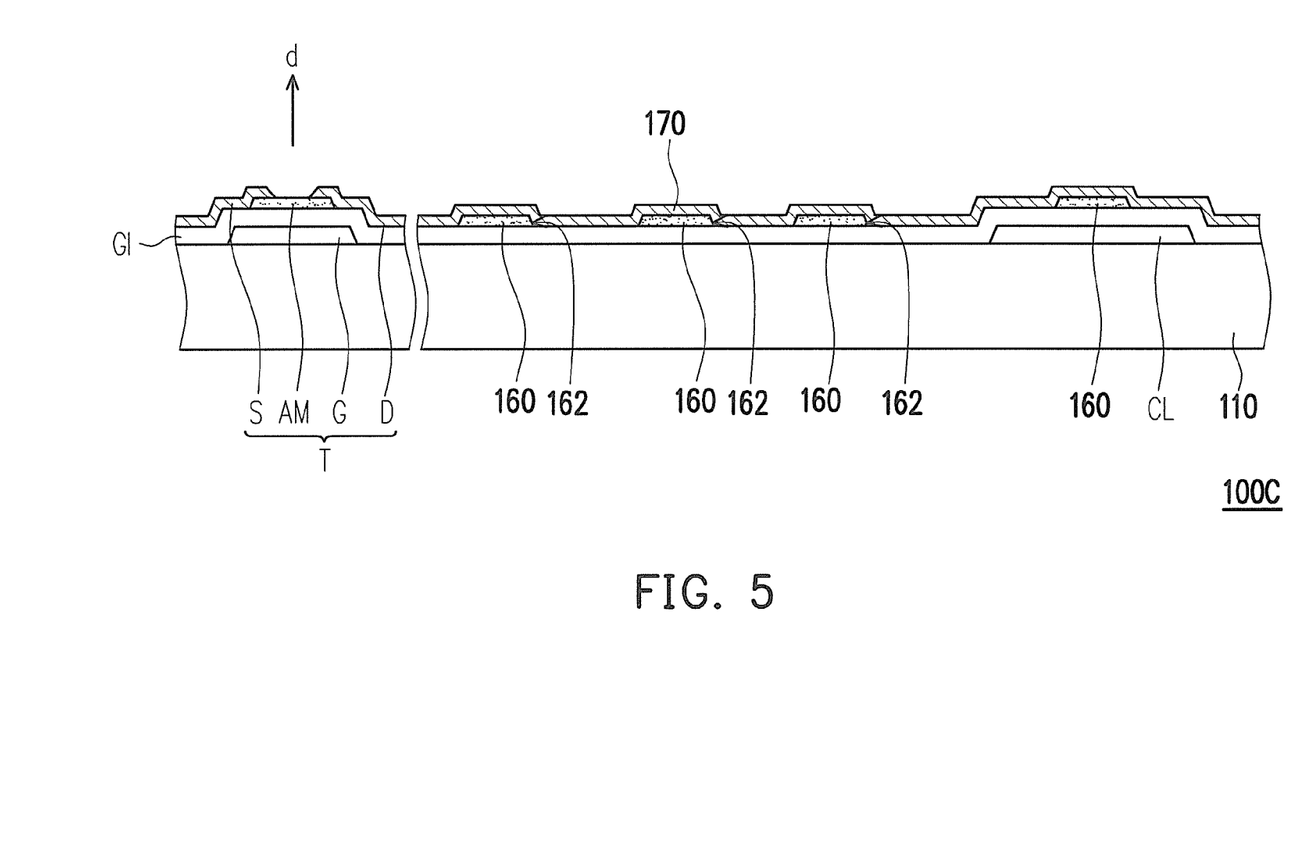
FIG. 5 is a schematic cross-sectional view illustrating a pixel structure according to another exemplary embodiment of the invention.

FIG. 5 is a schematic cross-sectional view illustrating a pixel structure according to another exemplary embodiment of the invention. The pixel structure 100C shown in FIG. 5 is similar to the pixel structure 100 shown in FIG. 1 and FIG. 2, and therefore the same components are labeled by the same reference numbers. The pixel structure 100C includes the substrate 110, the active device T located on the substrate 110, a second reflective pattern 170, and the floating channel layer 160. The active device T includes a gate G, a channel AM, a source S, and a drain D. The source S and the drain D are connected to the channel AM and are separated from each other. The channel AM and the gate G are stacked in a thickness direction d. The second reflective pattern 170 is electrically connected to the drain D of the active device T. Besides, the second reflective pattern 170 may be a complete pattern and covers the entire pixel area. In the present embodiment, the second reflective pattern 170 and the drain D of the active device T may be in the same film layer.

The floating channel layer 160 and the channel AM of the active device T are in the same film layer. Here, the floating channel layer 160 is located between the second reflective pattern 170 and the substrate 110 and has a plurality of openings 162. The second reflective pattern 170 covers the openings 162 and is stacked on the floating channel layer 160. According to the present embodiment, the pixel structure 100C further includes a capacitor electrode line CL that is connected to a reference electric potential. The capacitor electrode line CL is located between the substrate 110 and the floating channel layer 160. In addition, the capacitor electrode line CL and the gate G of the active device T may be in the same film layer, which should however not be construed as a limitation to the invention. The pixel structure 100C may further include a first insulation layer GI that is located between the substrate 110 and the floating channel layer 160.

Since the floating channel layer 160 has a plurality of openings 162, and the second reflective pattern 170 covers the openings 162 and is stacked on the floating channel layer 160, the second reflective pattern 170 may have reflective surfaces that are inclined toward different directions. Through these reflective surfaces, the pixel structure 100C is able to reflect the incident light toward various directions, so as to optimize the optical characteristics of the reflective display equipped with the pixel structure 100C.

Figure 6:
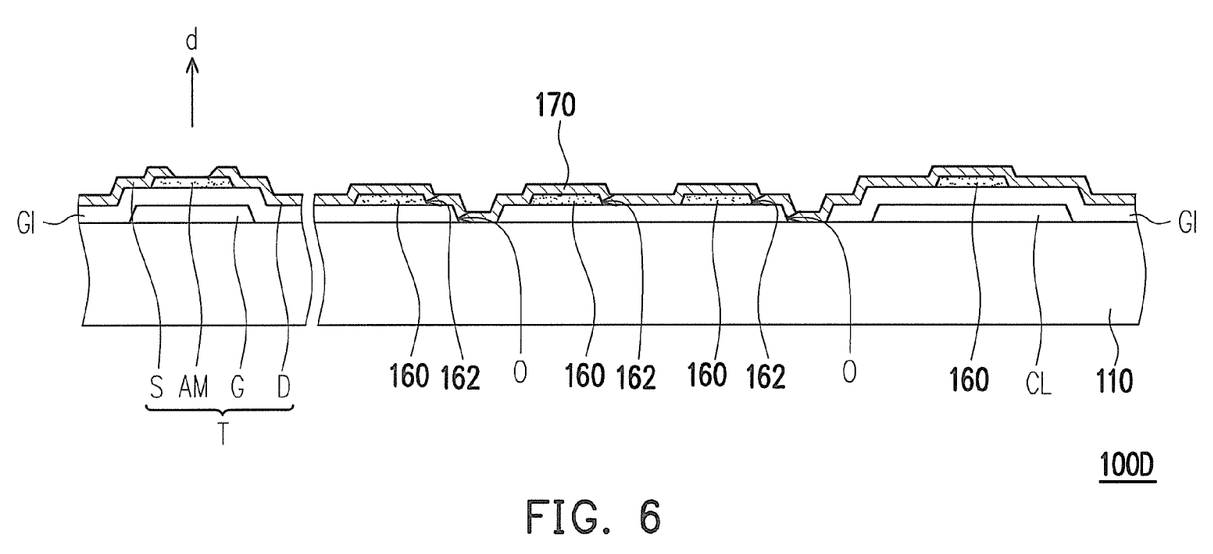
FIG. 6 is a schematic cross-sectional view illustrating a pixel structure according to an exemplary embodiment of the invention.

FIG. 6 is a schematic cross-sectional view illustrating a pixel structure according to an exemplary embodiment of the invention. The pixel structure 100D shown in FIG. 6 is similar to the pixel structure 100C shown in FIG. 5, and therefore the same components are labeled by the same reference numbers. The difference between the pixel structure 100D and the pixel structure 100C rests in that the first insulation layer GI located between the floating channel layer 160 and the substrate 110 in the pixel structure 100D may further have a plurality of first contact windows O. The first contact windows O may penetrate the first insulation layer GI and expose the substrate 110. Besides, the concave-up first contact windows O may be filled with the second reflective pattern 170, such that the reflective surfaces in the pixel structure 100D may be more diverse, and that the optical characteristics of the reflective display having the pixel structure 100D may be improved.

Figure 7:
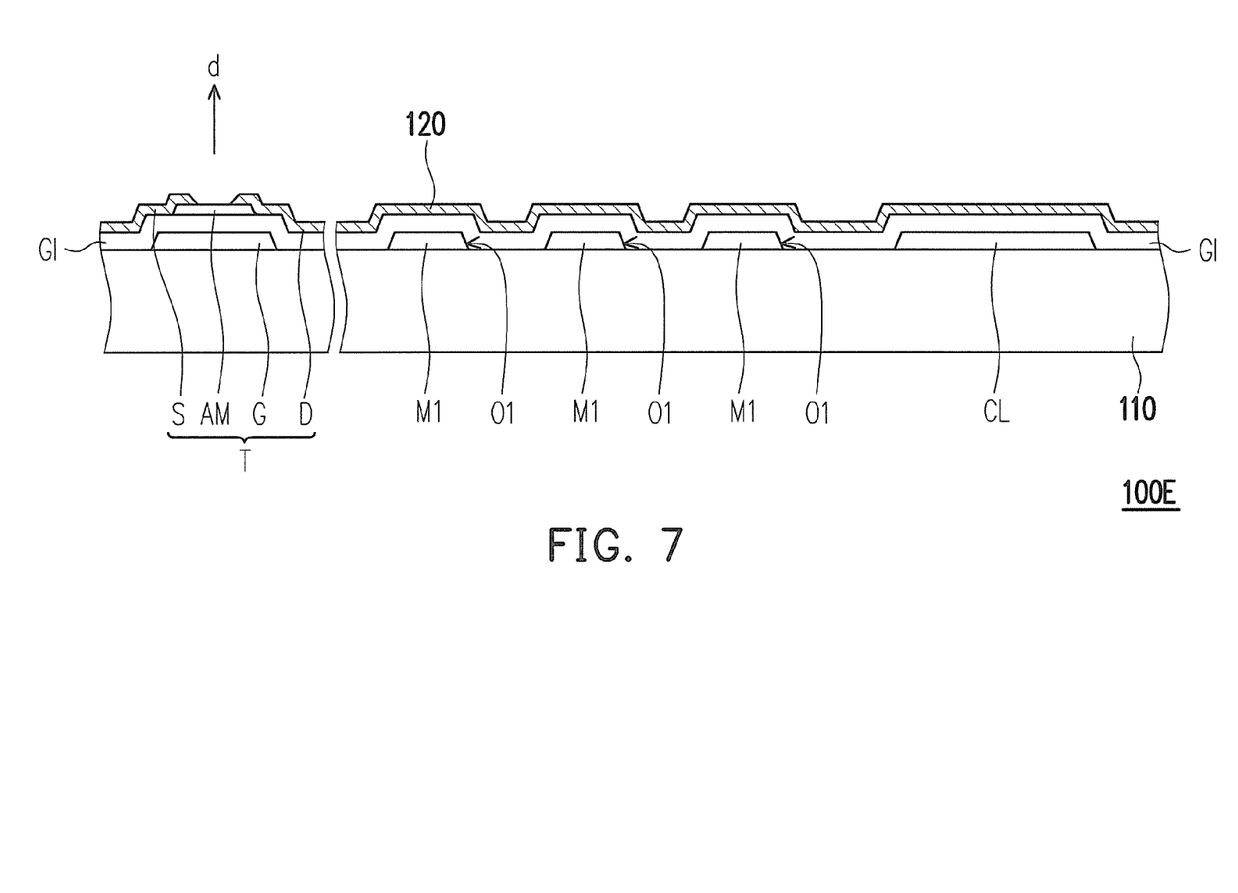
FIG. 7 is a schematic cross-sectional view illustrating a pixel structure according to another exemplary embodiment of the invention.

FIG. 7 is a schematic cross-sectional view illustrating a pixel structure according to another exemplary embodiment of the invention. The pixel structure 100E shown in FIG. 7 is similar to the pixel structure 100 shown in FIG. 1 and FIG. 2, and therefore the same components are labeled by the same reference numbers. The pixel structure 100E includes the substrate 110, the active device T located on the substrate 110, a first reflective pattern M1, and the second reflective pattern 120. The active device T includes a gate G, a channel CH, a source S, and a drain D. The source S and the drain D are connected to the channel CH and separated from each other, and the channel CH and the gate G are stacked in a thickness direction d. The first reflective pattern M1 is electrically insulated from the gate G of the active device T, and the first reflective pattern M1 and the gate G of the active device T are in the same film layer. The first reflective pattern M1 is electrically insulated from the capacitor electrode line CL, and the first reflective pattern M1 and the capacitor electrode line CL are in the same film layer. Besides, the first reflective pattern M1 has a plurality of first contact openings O1. The second reflective pattern 120 is electrically connected to the drain D of the active device T. In the present embodiment, the second reflective pattern 120 and the drain D of the active device T may be in the same film layer. Besides, the second reflective pattern 120 is stacked on the first reflective pattern M1 and completely covers the first reflective pattern M1 and the first contact openings O1. Namely, the second reflective pattern 120 covers the entire pixel area. The pixel structure 100E may further include a first insulation layer GI that is located between the first reflective pattern M1 and the second reflective pattern 120. Since the first reflective pattern M1 has a plurality of first contact openings O1, and the second reflective pattern 120 is stacked on the first reflective pattern M1 and covers the first contact openings O1, the second reflective pattern 120 may have reflective surfaces that are inclined toward different directions. Through these reflective surfaces, the pixel structure 100E is able to reflect the incident light toward various directions, so as to optimize the optical characteristics of the reflective display equipped with the pixel structure 100E.

Figure 8:
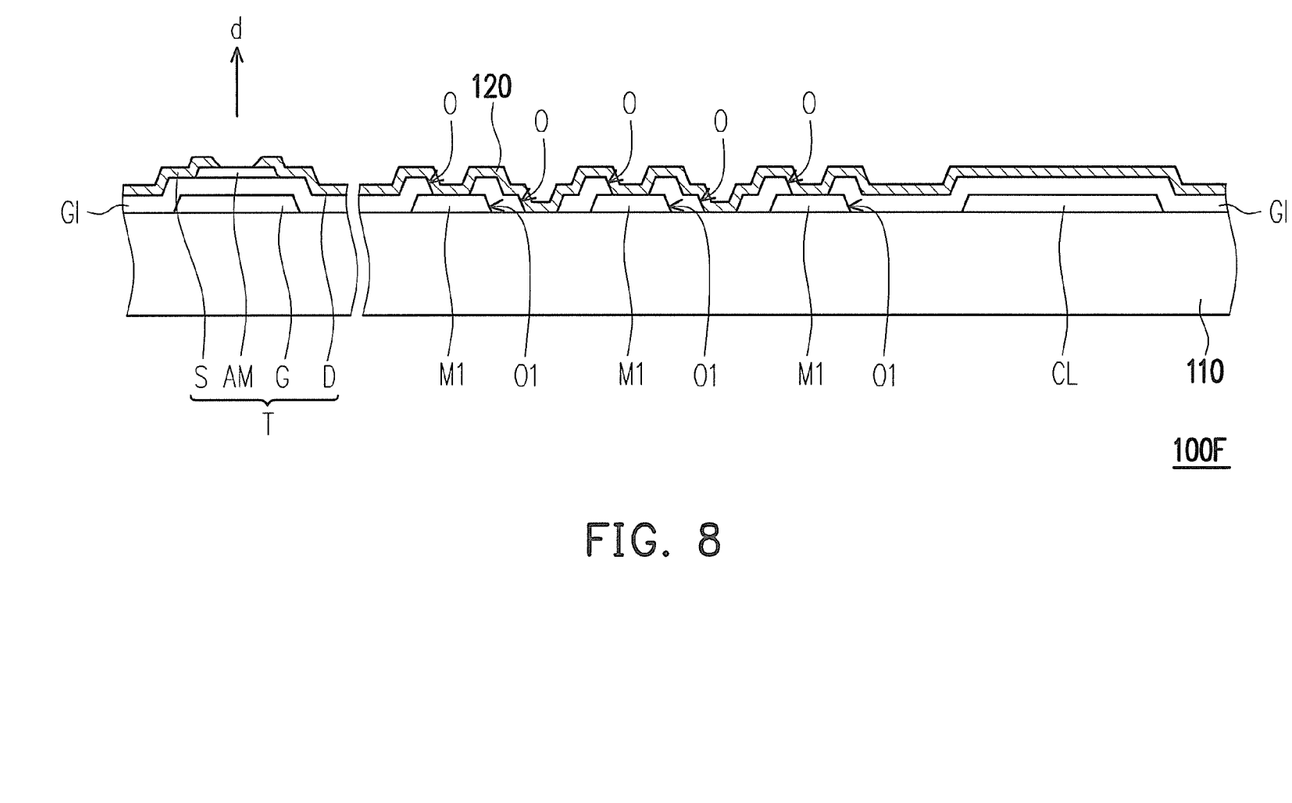
FIG. 8 is a schematic cross-sectional view illustrating a pixel structure according to another exemplary embodiment of the invention.

FIG. 8 is a schematic cross-sectional view illustrating a pixel structure according to another exemplary embodiment of the invention. The pixel structure 100F shown in FIG. 8 is similar to the pixel structure 100E shown in FIG. 7, and therefore the same components are labeled by the same reference numbers. The difference between the pixel structure 100F and the pixel structure 100E rests in that the first insulation layer GI located between the second reflective pattern 120 and the substrate 110 in the pixel structure 100F may further has a plurality of first contact windows O. The first contact windows O may be filled with the second reflective pattern 120. Besides, the first contact windows O may penetrate the first insulation layer GI. Parts of the first contact windows O expose the first reflective pattern M1, and the first contact windows O are filled with the second reflective pattern 120 that is electrically connected to the first reflective pattern M1. The other parts of the first contact windows O expose the substrate 110 and are located in the first contact openings O1 of the first reflective pattern M1, and the first contact windows O are filled with the second reflective pattern 120 that is electrically connected to the substrate 110. Besides, the concave-up first contact windows O may be filled with the second reflective pattern 120, such that the reflective surfaces in the pixel structure 100F may be more diverse, and that the optical characteristics of the reflective display having the pixel structure 100F may be improved.

Figure 9:
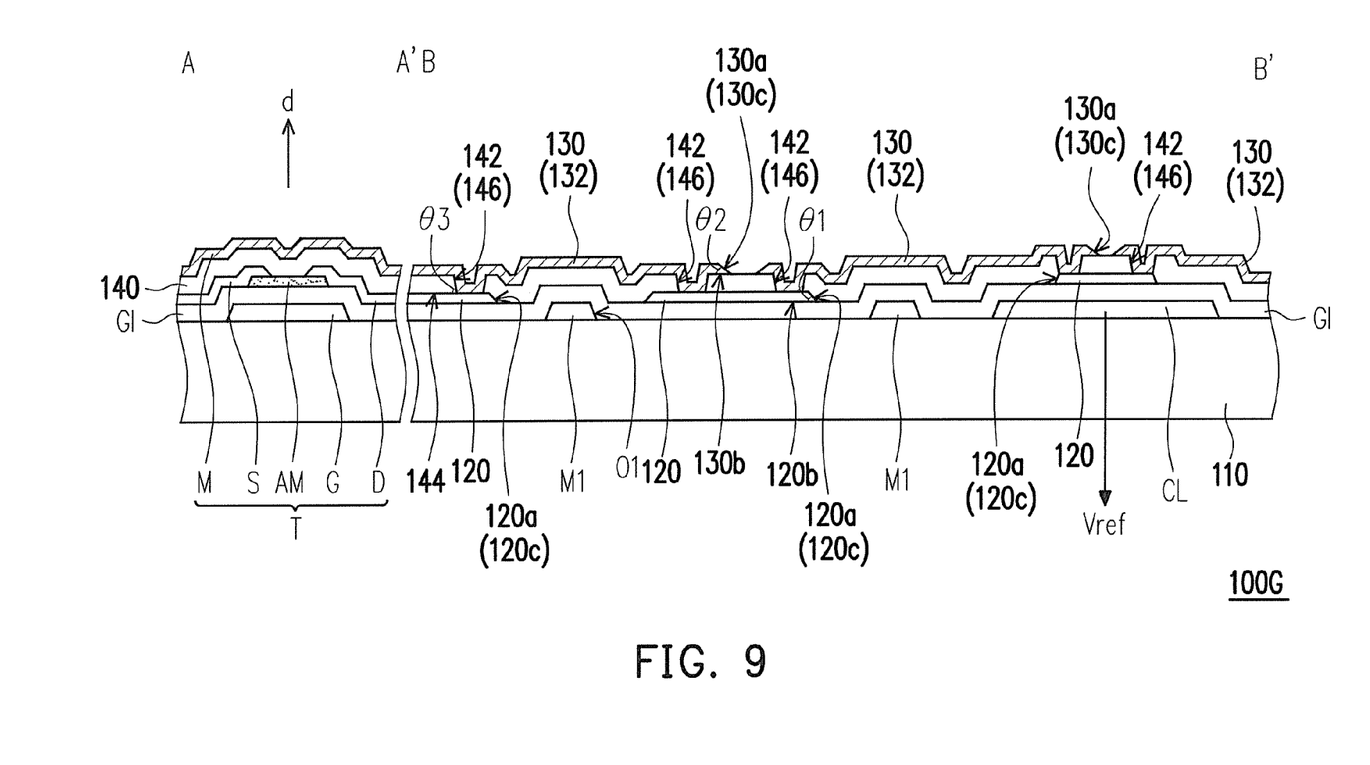
FIG. 9 is a schematic cross-sectional view illustrating a pixel structure according to another exemplary embodiment of the invention.

FIG. 9 is a schematic cross-sectional view illustrating a pixel structure according to another exemplary embodiment of the invention. The pixel structure 100G shown in FIG. 9 is similar to the pixel structure 100 shown in FIG. 1 and FIG. 2, and therefore the same components are labeled by the same reference numbers. The difference between the pixel structure 100G and the pixel structure 100 shown in FIG. 1 and FIG. 2 lies in that the pixel structure 100G further includes a first reflective pattern M1. The first reflective pattern M1 is electrically insulated from the gate G of the active device T, and the first reflective pattern M1 and the gate G of the active device T are in the same film layer. Besides, the first reflective pattern M1 has a plurality of first contact openings O1. At least one of the second reflective pattern 120 and the third reflective pattern 130 may be overlapped with the first contact openings O1 in the thickness direction d. The first reflective pattern M1 allows the reflective surfaces in the pixel structure 100G to be more diverse, and that the optical characteristics of the reflective display having the pixel structure 100G may be improved.

To sum up, in the pixel structure described in an embodiment of the invention, any two of the floating channel layer, the first reflective pattern, the second reflective pattern, and the third reflective pattern may be stacked together, so as to define reflective surfaces that have different inclined angles or incline toward different directions. Through these reflective surfaces, the pixel structure is able to reflect the incident light toward various directions, so as to optimize the optical characteristics of the reflective display equipped with said pixel structure.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A pixel structure comprising:
   a substrate;
   an active device located on the substrate, the active device comprising a gate, a channel, a source, and a drain, the source and the drain being connected to the channel and separated from each other, the channel and the gate being stacked in a thickness direction;
   a first reflective pattern electrically connected to the drain of the active device, the first reflective pattern having a plurality of first contact openings;
   a first insulation layer having a portion conformal to an edge of the first contact openings of the first reflective pattern; and
   a second reflective pattern electrically connected to the drain of the active device and conformal to the portion of the first insulation layer to have an oblique surface corresponding to the edge of the first contact openings of the first reflective pattern, the second reflective pattern being stacked on the first reflective pattern and covering the first contact openings of the first reflective pattern, the first reflective pattern being located between the second reflective pattern and the substrate.

2. The pixel structure as recited in claim 1, wherein the second reflective pattern has at least one second contact opening exposing an area where the first reflective pattern is, and the second contact opening and the first contact openings are not overlapped in the thickness direction.

3. The pixel structure as recited in claim 2, wherein the first reflective pattern has a bottom surface facing the substrate, each of the first contact openings has an inclined surface inclining relative to the substrate, a first included angle within the first reflective pattern is defined by the bottom surface of the first reflective pattern and the inclined surface of each of the first contact openings, the second reflective pattern has a bottom surface facing the substrate, the at least one second contact opening has an inclined surface inclining relative to the substrate, a second included angle within the second reflective pattern is defined by the bottom surface of the second reflective pattern and the inclined surface of the at least one second contact opening, and the first included angle is different from the second included angle.

4. The pixel structure as recited in claim 1, further comprises a first insulation layer located between the first reflective pattern and the second reflective pattern.

5. The pixel structure as recited in claim 4, wherein the first insulation layer has a plurality of first contact windows, and the first contact windows are filled with the second reflective pattern electrically connected to the first reflective pattern.

6. The pixel structure as recited in claim 5, wherein the first reflective pattern has a bottom surface facing the substrate, each of the first contact openings has an inclined surface inclining relative to the substrate, a first included angle within the first reflective pattern is defined by the bottom surface of the first reflective pattern and the inclined surface of each of the first contact openings, the first insulation layer has a bottom surface facing the substrate, each of the first contact windows has an inclined surface inclining relative to the substrate, a third included angle within the first insulation layer is defined by the bottom surface of the first insulation layer and the inclined surface of each of the first contact windows, and the first included angle is different from the third included angle.

7. The pixel structure as recited in claim 5, wherein the second reflective pattern has at least one second contact opening exposing an area where the first reflective pattern and the first insulation layer are.

8. The pixel structure as recited in claim 1, wherein the first reflective pattern and the drain of the active device are in the same film layer.

9. The pixel structure as recited in claim 1, further comprising a capacitor electrode line connected to a reference electric potential, the capacitor electrode line being located between the substrate and the first reflective pattern, the first reflective pattern being located between the second reflective pattern and the capacitor electrode line.

10. The pixel structure as recited in claim 1, further comprising a data line and a scan line, the data line being connected to the source, the scan line being connected to the gate.

11. The pixel structure as recited in claim 1, wherein the first insulation layer is located between the substrate and the first reflective pattern.

12. The pixel structure as recited in claim 1, further comprising a third reflective pattern electrically insulated from the gate of the active device, the third reflective pattern and the gate of the active device being in the same film layer, the third reflective pattern having a plurality of third contact openings.

* * * * *